United States Patent
Okabe et al.

(10) Patent No.: US 10,991,729 B2
(45) Date of Patent: Apr. 27, 2021

(54) ACTIVE MATRIX SUBSTRATE, OPTICAL SHUTTER SUBSTRATE, DISPLAY DEVICE, AND METHOD FOR MANUFACTURING ACTIVE MATRIX SUBSTRATE

(71) Applicant: Sharp Kabushiki Kaisha, Sakai (JP)

(72) Inventors: Tohru Okabe, Sakai (JP); Hirohiko Nishiki, Sakai (JP); Takeshi Yaneda, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 345 days.

(21) Appl. No.: 16/305,417

(22) PCT Filed: Jun. 16, 2017

(86) PCT No.: PCT/JP2017/022245
§ 371 (c)(1),
(2) Date: Nov. 29, 2018

(87) PCT Pub. No.: WO2017/221815
PCT Pub. Date: Dec. 28, 2017

(65) Prior Publication Data
US 2020/0328235 A1    Oct. 15, 2020

(30) Foreign Application Priority Data

Jun. 23, 2016   (JP) ............................. JP2016-124791

(51) Int. Cl.
*H01L 27/12*   (2006.01)
*G02B 26/02*   (2006.01)
(Continued)

(52) U.S. Cl.
CPC .......... *H01L 27/1248* (2013.01); *G02B 26/02* (2013.01); *G02F 1/1368* (2013.01);
(Continued)

(58) Field of Classification Search
CPC ...................... H01L 21/3205; G02F 1/136227
See application file for complete search history.

(56) References Cited

U.S. PATENT DOCUMENTS

2008/0035920 A1    2/2008   Takechi et al.
2010/0090942 A1*   4/2010   Sumi .................... G09G 3/3651
                                                        345/102

(Continued)

FOREIGN PATENT DOCUMENTS

EP     1 859 311 B1    11/2008
JP     2008-040343 A    2/2008
(Continued)

OTHER PUBLICATIONS

Official Communication issued in International Patent Application No. PCT/JP2017/022245, dated Aug. 29, 2017.

*Primary Examiner* — Alia Sabur
(74) *Attorney, Agent, or Firm* — Keating & Bennett, LLP

(57) ABSTRACT

An active matrix substrate having low susceptibility to contact failure between two conductor films is provided. An oxide semiconductor film converted into a conductor is provided in a layer between a substrate and a first metal film. Within a contact hole, the oxide semiconductor film converted into a conductor is in contact with a second metal film. Outside of the contact hole, the oxide semiconductor film converted into a conductor is in contact with the first metal film.

9 Claims, 16 Drawing Sheets

(51) Int. Cl.
*G02F 1/1362* (2006.01)
*G02F 1/1368* (2006.01)
*H01L 21/441* (2006.01)
*H01L 29/66* (2006.01)

(52) U.S. Cl.
CPC ...... *G02F 1/136227* (2013.01); *H01L 21/441* (2013.01); *H01L 27/1225* (2013.01); *H01L 29/66969* (2013.01)

(56) References Cited

U.S. PATENT DOCUMENTS

| | | |
|---|---|---|
| 2015/0162399 A1 | 6/2015 | Sato |
| 2016/0104759 A1 | 4/2016 | Oshima |
| 2016/0380006 A1 | 12/2016 | Uchida |
| 2017/0287943 A1* | 10/2017 | Ma ................... H01L 29/66969 |

FOREIGN PATENT DOCUMENTS

| | | |
|---|---|---|
| JP | 2011-043856 A | 3/2011 |
| JP | 2015-108731 A | 6/2015 |
| JP | 2016-057547 A | 4/2016 |
| JP | 2016-080744 A | 5/2016 |
| WO | 2015/087586 A1 | 6/2015 |

* cited by examiner

ACTIVE MATRIX SUBSTRATE, OPTICAL SHUTTER SUBSTRATE, DISPLAY DEVICE, AND METHOD FOR MANUFACTURING ACTIVE MATRIX SUBSTRATE

TECHNICAL FIELD

The disclosure relates to an active matrix substrate for use in a display device.

BACKGROUND ART

Active matrix substrates, in which a plurality of thin film transistors (TFTs) are arranged, are used in display devices, such as liquid crystal display devices, organic EL display devices, and Micro Electro Mechanical Systems (MEMS) displays.

CITATION LIST

Patent Literature

PTL 1: JP 2011-43856 A (published on Mar. 3, 2011)

SUMMARY

Technical Problem

Typically, an active matrix substrate includes a structure in which two conductor films formed in different layers are connected to each other with a contact hole therebetween. When electrolytic corrosion occurs between the two conductor films within the contact hole, a contact failure may occur between the two conductor films.

An object of the disclosure is to provide an active matrix substrate having low susceptibility to contact failure between two conductor films.

Solution to Problem

According to an aspect of the disclosure, an active matrix substrate includes a substrate, a first metal film, an interlayer insulating film, and a second metal film. The interlayer insulating film is formed in an upper layer on the first metal film. The second metal film is formed in the upper layer on the interlayer insulating film. The first metal film and the second metal film are electrically connected to each other via a contact hole formed in the interlayer insulating film. An oxide semiconductor film converted into a conductor is provided in a layer between the substrate and the first metal film. Within the contact hole, the oxide semiconductor film converted into a conductor is in contact with the second metal film. Outside of the contact hole, the oxide semiconductor film converted into a conductor is in contact with the first metal film.

Note that the term an "oxide semiconductor film converted into a conductor" refers to an oxide semiconductor film that serves as a conductor, which is different from an oxide semiconductor film that serves as a channel of a transistor, and the term indicates a state in which the oxide semiconductor film has low resistance.

Advantageous Effects of Disclosure

The configuration described above enables realization of an active matrix substrate having low susceptibility to contact failure between two conductor films.

DESCRIPTION OF EMBODIMENTS

Embodiments of the disclosure will be described below with reference to FIGS. 1A to 16.

First Embodiment

MEMS Display

Figure 1A:
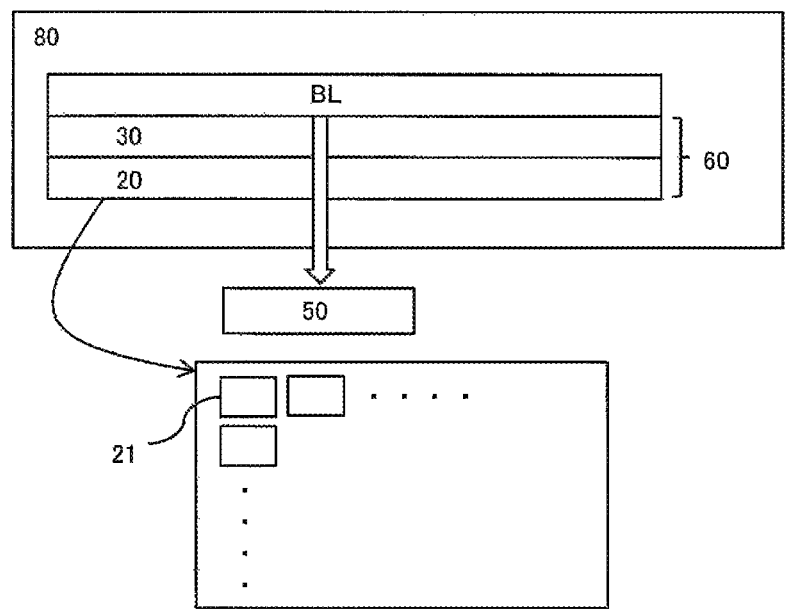
FIGS. 1A to 1C are schematic diagrams illustrating a configuration of a display device according to a first embodiment.

As illustrated in FIG. 1A, a MEMS display 80 according to a first embodiment includes an optical shutter device 60 and a backlight BL. The optical shutter device 60 includes an optical shutter substrate 20 and a counter substrate 30, which faces the optical shutter substrate 20. The backlight BL emits LED light or laser light to the optical shutter substrate 20 through the counter substrate 30.

Configuration of Optical Shutter Substrate

Figure 2A:
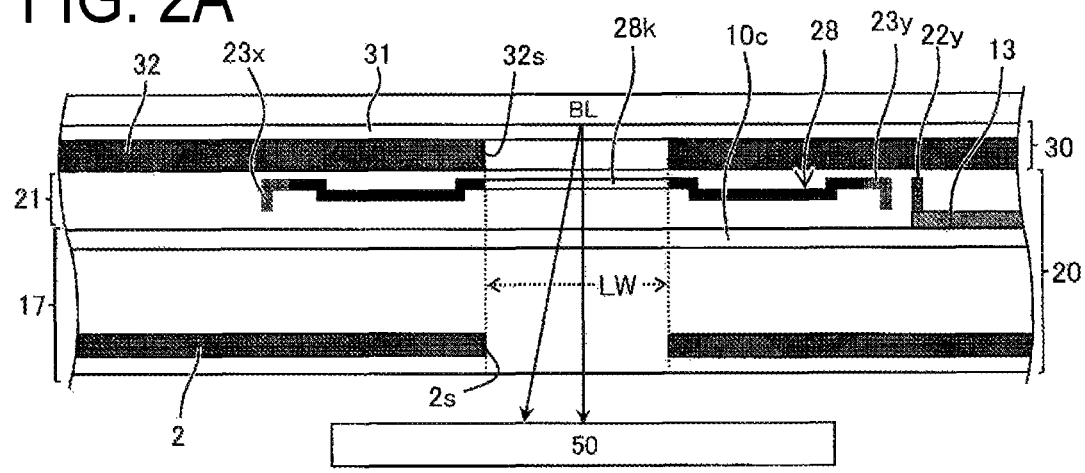
FIGS. 2A and 2B are cross-sectional views illustrating a configuration of an optical shutter substrate according to the first embodiment.

As illustrated in FIG. 2A, the optical shutter substrate 20 includes an active matrix substrate 17 and a plurality of optical shutter mechanisms 21. The active matrix substrate 17 includes thin film transistors (TFTs). The optical shutter mechanisms 21 are Micro Electro Mechanical Systems (MEMS) and are disposed on the active matrix substrate 17 on a side closer to the backlight BL. The optical shutter mechanism 21 is provided for each of the pixels. The optical shutter substrate 20 is provided with light transmission paths. Light passes through the optical shutter mechanisms 21 and then passes through the light transmission paths.

Figure 1B:
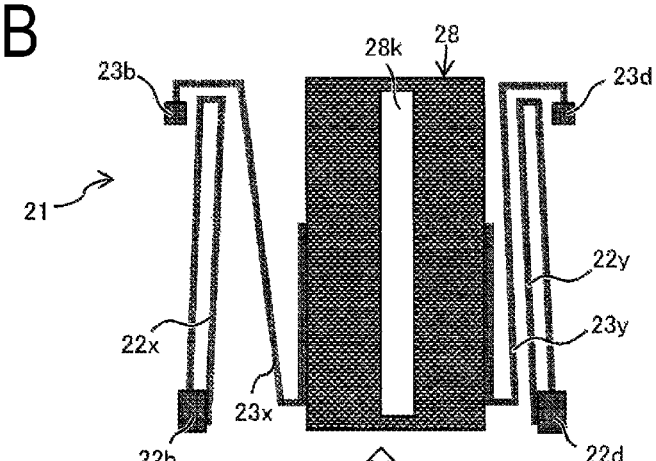
Figure 1C:
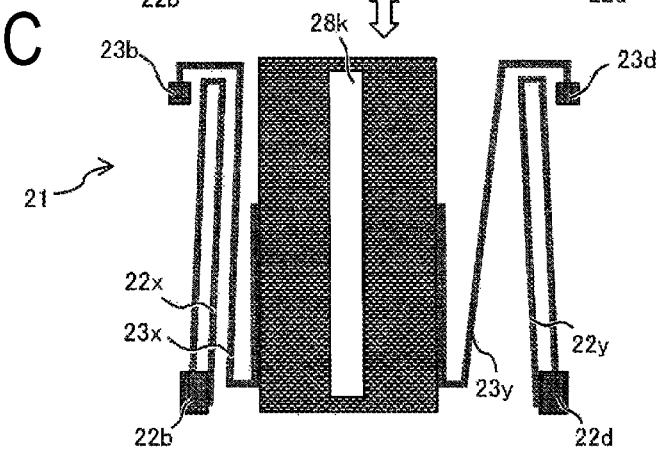

As illustrated in FIGS. 1B and 1C, the optical shutter mechanism 21 includes a shutter body 28, a shutter beam 23x, a shutter beam 23y, a drive beam 22x, and a drive beam 22y. The shutter body 28 includes an opening 28k. The shutter beam 23x is connected to one side end of the shutter body 28. The shutter beam 23y is connected to another side end of the shutter body 28. The drive beam 22x faces the shutter beam 23x. The drive beam 22y faces the shutter beam 23y.

The shutter beam 23x is connected to a shutter line in the active matrix layer with a shutter anchor 23b therebetween, the shutter beam 23y is connected to the shutter line in the active matrix layer with a shutter anchor 23d therebetween, the drive beam 22x is connected to a TFT in the active matrix layer with a drive anchor 22b therebetween, and the drive beam 22y is connected to another TFT in the active matrix layer with a drive anchor 22d therebetween. Through electric potential control of the drive beams 22x, 22y, the shutter beams 23x, 23y, each of which is in the form of a spring, are deformed, and accordingly the shutter body 28 slides in a direction parallel to the substrate plane. Thus, the amount of light that is emitted to a viewer 50 through the optical shutter mechanisms and the light transmission path is controlled to display images.

Figure 3:
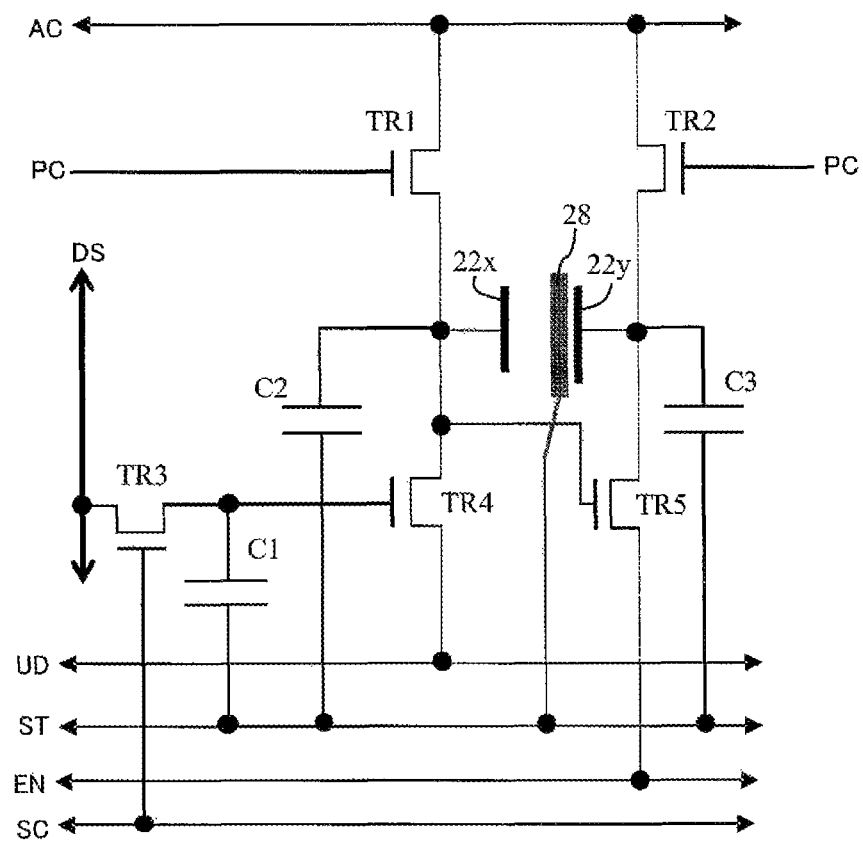
FIG. 3 is a circuit diagram illustrating a configuration of an optical shutter substrate according to the first embodiment.

FIG. 3 is a circuit diagram illustrating the configuration of a portion of the optical shutter substrate 20. As illustrated in FIG. 3, the optical shutter substrate includes seven signal lines, transistors TR1 to TR5, a data holding capacitor C1, a master capacitor C2, and a slave capacitor C3. The seven signal lines are a scanning line SC, a data line DS, an actuate line AC, an update line UD, a shutter line ST, a pre-charge line PC, and an enable line EN.

In the configuration of FIG. 3, when the scanning line SC is selected, the data voltage that determines the opening or closing of the optical shutter mechanism is stored in the data holding capacitor C1 via the data line DS and the transistor TR3. During this period, the update line UD is High, and the transistor TR4 is off regardless of the data voltage.

Next, when the pre-charge line PC is selected, the voltage from the actuate line AC is stored in the drive beam 22x and the drive beam 22y via the transistors TR1 and TR2, respectively. The drive beam 22x is connected to the master capacitor C2, and the drive beam 22y is connected to the slave capacitor C3.

Next, when the update line UD changes from High to Low, the transistor TR4 is controlled in accordance with the data voltage. Specifically, when the data voltage is High, the transistor TR4 is turned on, and when the data voltage is Low, the transistor TR4 remains off.

Next, when the enable line EN changes from High to Low, the transistor TR5 is controlled in accordance with the voltage of the drive beam 22x. Specifically, when the enable line EN is Low and the drive beam 22x is High, the transistor TR5 is turned on, and when the enable line EN is High and the drive beam 22x is Low, the transistor TR5 is turned off.

Thus, the polarity of the drive beam 22x and the polarity of the drive beam 22y are opposite to each other. The drive beam (22x or 22y) having a polarity opposite to the polarity of the shutter body 28 draws the shutter body 28 by the electric force. Note that a signal whose polarity is periodically reversed is provided from the shutter line ST to the shutter body 28 to prevent electrostatic charging.

Figure 2B:
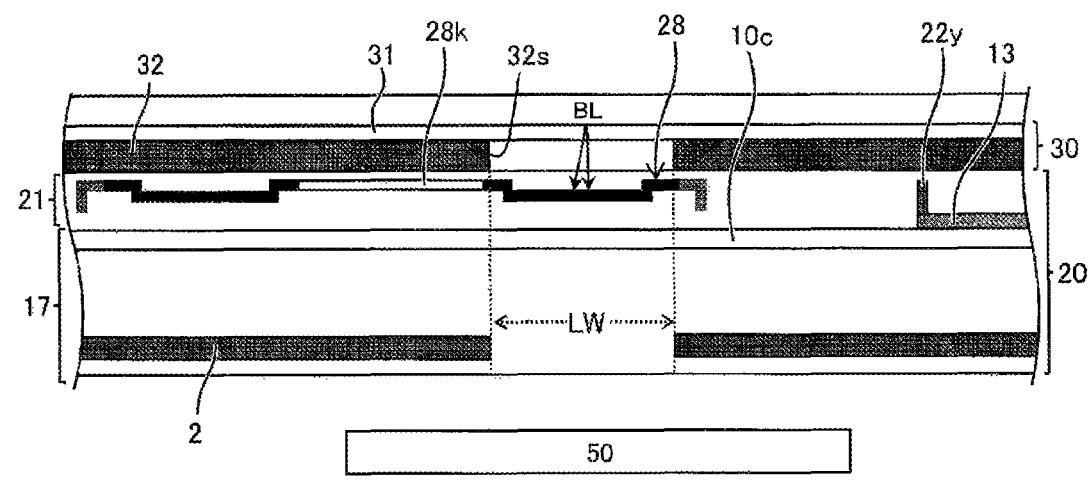

As illustrated in FIGS. 1B to 2B, in the optical shutter mechanism 21, when the shutter body 28 is drawn toward the drive beam 22y, the optical shutter mechanism 21 is placed in an open state (see FIGS. 1B and 2A), and when the shutter body 28 is drawn toward the drive beam 22x, the optical shutter mechanism 21 is placed in a closed state (see FIGS. 1C and 2B).

The optical shutter device of FIGS. 2A and 2B is as follows. The counter substrate 30 is provided between the optical shutter substrate 20 and the backlight BL. The counter substrate 30 includes a light shielding layer 32 formed on a glass substrate 31. The light shielding layer 32 is made from metal or the like. A light transmission path LW is formed to extend, in a direction perpendicular to the substrate plane, from a slit 32 formed in the light shielding layer 32 of the counter substrate 30 to a slit 2s of a light shielding film 2 of the optical shutter substrate 20. When the opening 28k of the shutter body 28 overlaps with the light transmission path LW (the optical shutter mechanism is in an open state), as illustrated in FIG. 2A, light from the backlight passes through the optical shutter mechanism 21 and the light transmission path LW to be emitted toward the viewer 50. When the portion other than the opening of the shutter body 28 overlaps with the light transmission path LW (the optical shutter mechanism 21 is in a closed state), as illustrated in FIG. 2B, light from the backlight is blocked.

Configuration of Active Matrix Substrate

Figure 4A:
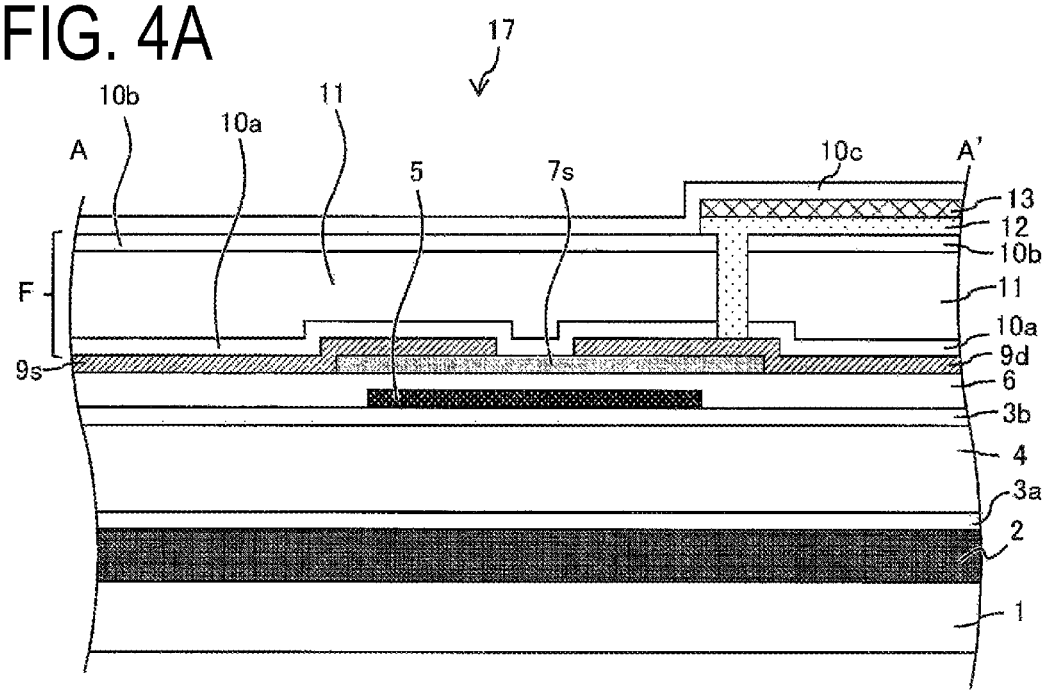
FIGS. 4A and 4B are cross-sectional views illustrating a configuration of an active matrix substrate (TFT portion) according to the first embodiment.
Figure 4B:
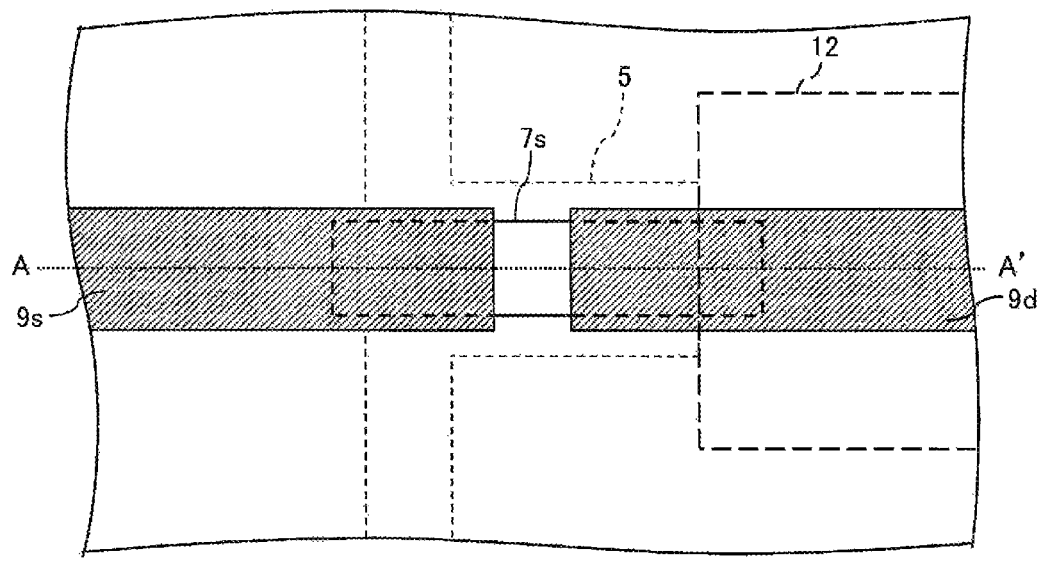
Figure 5A:
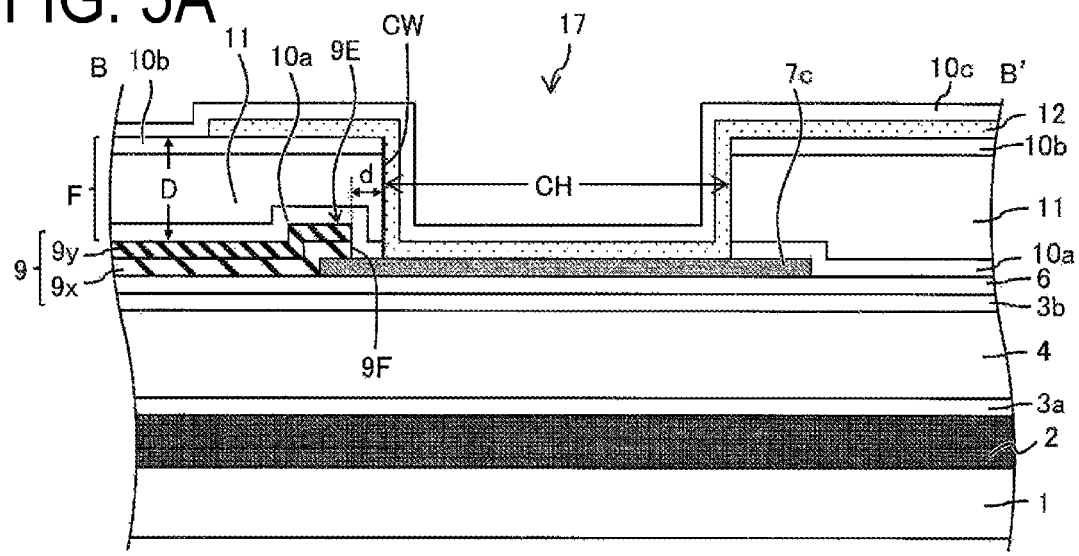
FIGS. 5A and 5B are cross-sectional views illustrating a configuration of an active matrix substrate (contact hole portion) according to the first embodiment.
Figure 5B:
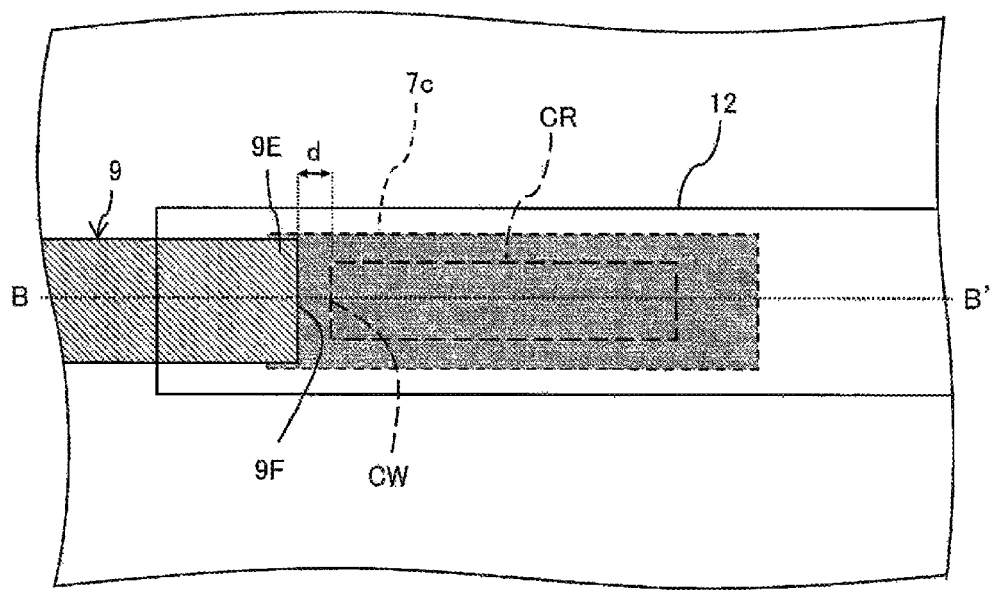

FIG. 4A is a cross-sectional view of a TFT (thin film transistor) portion in an active matrix substrate of the first embodiment, and FIG. 4B is a perspective plan view corresponding to FIG. 4A. FIG. 5A is a cross-sectional view of a contact portion of a metal film in the active matrix substrate of the first embodiment, and FIG. 5B is a perspective plan view corresponding to FIG. 5A. Note that, in the first embodiment, the TFT portion is of a channel etched structure.

As illustrated in FIGS. 4A to 5B, the active matrix substrate 17 includes a glass substrate 1, the light shielding film 2, a first inorganic insulating film 3a, a lower transparent film 4, a second inorganic insulating film 3b, a lower metal film 5, a gate insulating film 6, an oxide semiconductor film 7s and a conductive film 7c, a first metal film 9 (9s, 9d), a first passivation film 10a, an upper transparent film 11, a second passivation film 10b, a second metal film 12, an upper metal film 13, and a third passivation film 10c. The light shielding film 2 is formed in an upper layer on the glass substrate 1. The first inorganic insulating film 3a is formed in an upper layer on the light shielding film 2. The lower transparent film 4 is formed in an upper layer on the first inorganic insulating film 3a. The second inorganic insulating film 3b is formed in an upper layer on the lower transparent film 4. The lower metal film 5 is formed in an upper layer on the second inorganic insulating film 3b. The gate insulating film 6 is formed in an upper layer on the lower metal film 5. The oxide semiconductor film 7s and the conductive film 7c are formed in an upper layer on the gate insulating film 6. The conductive film 7c is obtained by converting an oxide semiconductor film into a conductor. The first metal film 9 (9s, 9d) are formed in an upper layer on the oxide semiconductor film 7s and the conductive film 7c. The first passivation film 10a is formed in an upper layer on the first metal film 9. The upper transparent film 11 is formed in an upper layer on the first passivation film 10a. The second passivation film 10b is formed in an upper layer on the upper transparent film 11. The second metal film 12 is formed in an upper layer on the second passivation film 10b. The upper metal film 13 is formed in an upper layer on the second metal film 12. The third passivation film 10c is formed in an upper layer on the upper metal film 13.

The conductive film 7c is an oxide semiconductor film converted into a conductor. The conductive film 7c has a lower resistance than that of an oxide semiconductor film that serves as the channel in a transistor and is in a state of an oxide semiconductor film that serves as a conductor.

The light shielding film 2 is formed from a coatable light-shielding resin (e.g., spin-on-glass material). The lower transparent film 4 and the upper transparent film 11 are each formed from a coatable light-transmissive resin (e.g. spin-on-glass material). The light shielding film 2, the lower transparent film 4, and the upper transparent film 11 each have a thickness of from 0.5 to 3 μm, which is greater than the thickness of the lower metal film 5 and greater than the thickness of the first metal film 9, and thus also serve as a flattening film.

The first and the second inorganic insulating films 3a, 3b are each provided to enhance adhesion between the film in the lower layer and the film in the upper layer. The thickness of each of the films is approximately from 50 to 200 nm, and the material of the films is, for example, $SiO_2$.

The gate insulating film 6 is formed by forming the film of a SiNx film and the film of a $SiO_2$ film successively by using a PECVD method. The gate insulating film 6 may be formed of a single film such as, a $SiO_2$ film or a SiNx film.

The oxide semiconductor film 7s and the oxide semiconductor film for obtaining the conductive film 7c are formed by patterning the film of an oxide semiconductor film formed by using a sputtering method. Oxide semiconductor has an electron mobility that is from 20 to 50 times greater than that of amorphous silicon, i.e., a non-crystalline semiconductor. This enables high-speed switching of the transistors of the optical shutter substrate and thus high-speed opening and closing of the shutter body 28 in the optical shutter mechanism.

The oxide semiconductor may include at least one metal element selected from In, Ga, and Zn. Examples of the oxide semiconductor include In—Ga—Zn—O based semiconductors (e.g., indium gallium zinc oxide). The In—Ga—Zn—O based semiconductor is a ternary oxide of In (indium), Ga (gallium), and Zn (zinc). The ratio (composition ratio) of In, Ga, and Zn is not particularly limited to a specific value and may be, for example, In:Ga:Zn=2:2:1, In:Ga:Zn=1:1:1, In:Ga:Zn=1:1:2, or the like.

The semiconductor oxide may be an In—Sn—Zn—O based semiconductor (e.g., $In_2O_3$—$SnO_2$—ZnO; InSnZnO). The In—Sn—Zn—O based semiconductor is a ternary oxide of In (indium), Sn (tin), and Zn (zinc).

Alternatively, the oxide semiconductor may be an In—Al—Zn—O based semiconductor, an In—Al—Sn—Zn—O based semiconductor, a Zn—O based semiconductor, an In—Zn—O based semiconductor, a Zn—Ti—O based semiconductor, a Cd—Ge—O based semiconductor, a Cd—Pb—O based semiconductor, CdO (cadmium oxide), a Mg—Zn—O based semiconductor, an In—Ga—Sn—O based semiconductor, an In—Ga—O based semiconductor, a Zr—In—Zn—O based semiconductor, a Hf—In—Zn—O based semiconductor, or the like. Note that Al denotes aluminum, Ti denotes titanium, Cd denotes cadmium, Ge denotes germanium, Pb denotes lead, Mg denotes magnesium, Zr denotes zirconium, and Hf denotes hafnium.

Each of the first to third passivation films 10a to 10c is formed by forming the film of a SiNx film and the film of a $SiO_2$ film successively by using a PECVD method and patterning the films. Each of the first to third passivation films 10a to 10c may be formed of a single film, such as a $SiO_2$ film or a SiNx film.

The lower metal film, the first metal film, and the upper metal film are each formed by forming, by using a sputtering method, a film or films of one or more metals and/or alloys thereof and patterning the film or films. Examples of such metals include aluminum (Al), tungsten (W), molybdenum (Mo), tantalum (Ta), chromium (Cr), titanium (Ti), and copper (Cu).

In the first embodiment, the first metal film 9 is a layered film including a lower film 9x (e.g., aluminum) and an upper film 9y (e.g., molybdenum nitride).

The second metal film 12 may be formed of a transparent metal film including Indium Tin Oxide (ITO) or Indium Zinc Oxide (IZO) or may be formed of copper (Cu).

In the present embodiment, the first and second metal films each include a material that experiences electrolytic corrosion when the materials are in contact with each other. Specifically, the first metal film 9 includes Al and the second metal film 12 includes ITO. However, the materials are not limited to these, and, for example, the first metal film 9 may include Al and the second metal film 12 may include Cu.

The optical shutter mechanism is formed by using n+ amorphous silicon, one or more metals and/or alloys thereof, and SiNx and by using a photolithography process, an etching process, or the like. Examples of such metals include aluminum (Al), tungsten (W), molybdenum (Mo), tantalum (Ta), chromium (Cr), titanium (Ti), and copper (Cu).

In FIG. 4A, the TFT (e.g. transistor TR4 in FIG. 3) is formed of the lower metal film 5, the gate insulating film 6, the oxide semiconductor film 7s, and the first metal films 9s, 9d. Additionally, the first metal film 9d and the second metal film 12 are in contact with each other and thus electrically connected to each other within a contact hole provided in an interlayer insulating film F including the first passivation film 10a, the upper transparent film 11, and the second passivation film 10b. Not that the upper metal film 13 is formed on the second metal film 12 and is in contact with the second metal film 12.

In FIG. 5A, the conductive film 7c is formed immediately below a contact hole CH provided in the interlayer insulating film F. The conductive film 7c is obtained by converting an oxide semiconductor film into a conductor. The perimeter portion of the conductive film 7c is located outside of the contact hole CH. That is, the conductive film 7c overlaps with the entire inner region of the contact hole CH. The conductive film 7c of FIGS. 5A and 5B is a film obtained by performing a plasma treatment on an oxide semiconductor film formed in the same layer (in the same process) as the oxide semiconductor film 7s (see FIGS. 4A and 4B), which serves as the channel of the TFT, and thus converting the film into a conductor.

At the bottom of the contact hole CH, the conductive film 7c (overlapping portion overlapping with the contact hole) is in contact with the second metal film 12, and thus the films are electrically connected to each other.

Further, the first metal film 9 (a layered film of the lower film 9x and the upper film 9y) is formed in such a manner that the first metal film 9 does not overlap with the contact hole CH. Outside of the bottom of the contact hole CH, the perimeter portion (non-overlapping portion not overlapping with the contact hole) of the conductive film 7c and an end portion 9E of the first metal film 9 (end portion of the lower film 9x) are in contact with each other and thus electrically connected to each other. Here, a portion of the interlayer insulating film F is present between a side wall CW of the contact hole CH and an end face 9F of the first metal film 9, and the distance d between the side wall CW of the contact hole CH and the end face 9F of the first metal film 9 is configured to be less (approximately not greater than 2 μm) than the thickness D of the interlayer insulating film F.

Method for Manufacturing Active Matrix Substrate

Figure 6:
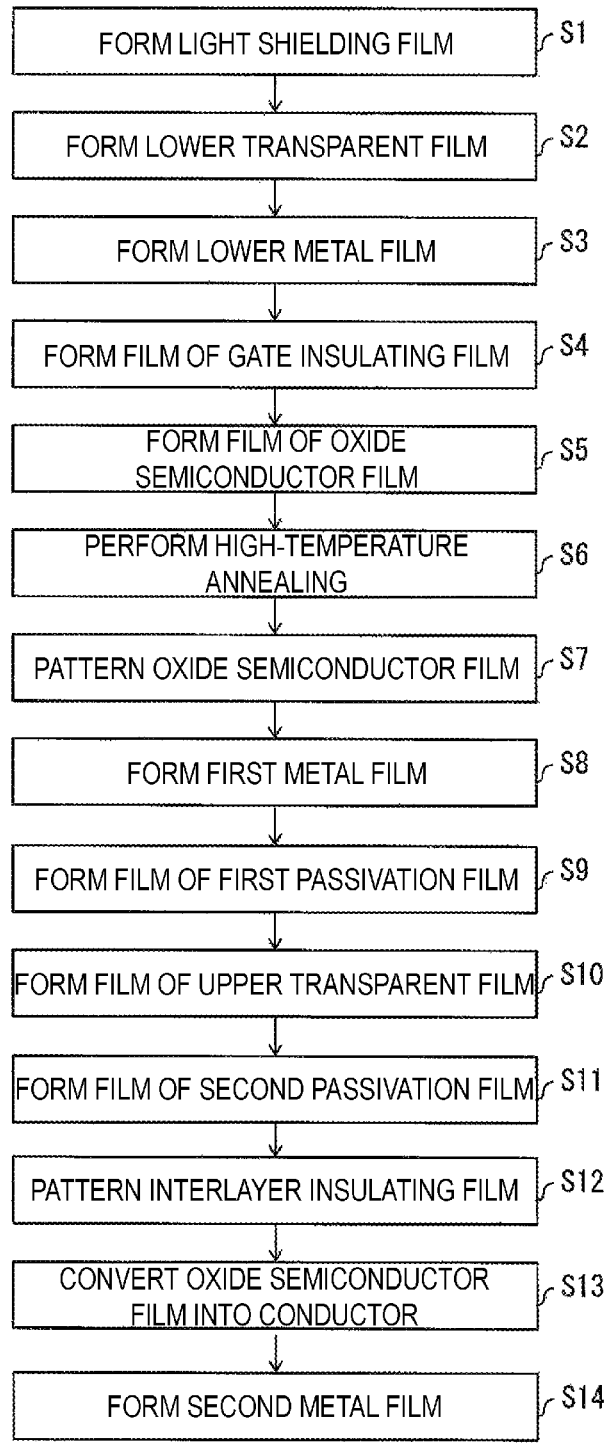
FIG. 6 is a flowchart illustrating a process for manufacturing an active matrix substrate according to the first embodiment.

FIG. 6 is a flowchart illustrating a portion of a process for manufacturing an active matrix substrate. In step S1, the film of the light shielding film 2 is formed and patterned, and in step S2, the film of the lower transparent film 4 is formed and patterned. In step S3, the film of the lower metal film 5 is formed and patterned, and in step S4, the film of the gate insulating film is formed.

In step S5, the film of the oxide semiconductor film is formed, and in step S6, the film is subjected to high-temperature annealing. The high-temperature annealing is performed under conditions including, for example, an atmosphere of nitrogen, a temperature of from 400 to 500° C., and a duration of from 1 to 2 hours.

In step S7, the oxide semiconductor film is patterned. Here, portions of the oxide semiconductor film are retained for the TFT channel region of FIG. 4A and for a contact region CR (see FIG. 5B) corresponding to the contact hole CH of FIG. 5A. Specifically, a portion of the oxide semiconductor film, the portion being larger than the contact region CR, is retained in such a manner as to envelop the contact region CR so that the perimeter portion of the oxide semiconductor film can extend beyond the contact region CR.

In step S8, the film of the first metal film 9 (e.g., a layered film of the lower film 9x including Al and the upper film 9y including MoN) is formed and patterned. Here, the end portion 9E of the first metal film 9 of FIGS. 5A and 5B is placed on the perimeter portion (portion extending beyond the contact region CR) of the oxide semiconductor film (the lower film 9x (Al) is brought into contact with the oxide semiconductor film), and the end face 9F of the first metal film 9 is positioned outside of the contact region CR.

In step S9, the film of the first passivation film 10a is formed. In step S10, the film of the upper transparent film 11 is formed. In step S11, the film of the second passivation film 10b is formed.

In step S12, the interlayer insulating film (first passivation film 10a, upper transparent film 11, and second passivation film 10b) is patterned. Here, the contact hole CH is formed in the interlayer insulating film F at the portion on the contact region CR, and thus the oxide semiconductor film is exposed at the bottom of the contact hole CH.

In step S13, a plasma treatment is performed on the oxide semiconductor film overlapping with the contact region CR by using, for example, argon (Ar), hydrogen (H), or the like, other than oxygen. Thus, in the oxide semiconductor film overlapping with the contact region CR, the portion overlapping with the end portion 9E of the first metal film 9 and the portion extending from the overlapping portion to the side wall of the contact hole CH (portion on which the interlayer insulating film F is formed) as well as the portion exposed at the bottom of the contact hole CH are converted into a conductor to form the conductive film 7c. Thus, the conductive film 7c is electrically connected to the first metal film 9 (lower film 9x).

Here, the distance d between the side wall CW of the contact hole CH and the end face 9F of the first metal film 9 is configured to be less than the thickness D of the interlayer insulating film F. This prevents the oxide semiconductor film 7s (see FIGS. 4A and 4B), which serves as a channel, from also being converted into a conductor in step S13.

In step S14, the second metal film 12 is formed on the interlayer insulating film F. Here, at the bottom of the contact hole CH, the second metal film 12 comes into contact with the conductive film 7c to be electrically connected thereto. As a result, the first metal film 9 and the second metal film 12 are electrically connected to each other with the conductive film 7c therebetween.

In the manner described above, the active matrix substrate 17 of FIGS. 5A and 5B can be formed.

Effects and the like of Active Matrix Substrate

In the active matrix substrate 17 of FIGS. 5A and 5B, the first metal film 9 and the second metal film 12 are connected to each other with the conductive film 7c therebetween below the contact hole. Thus, the first metal film 9 (lower film 9x, in particular) and the second metal film 12 are not in contact with each other.

Figure 16:
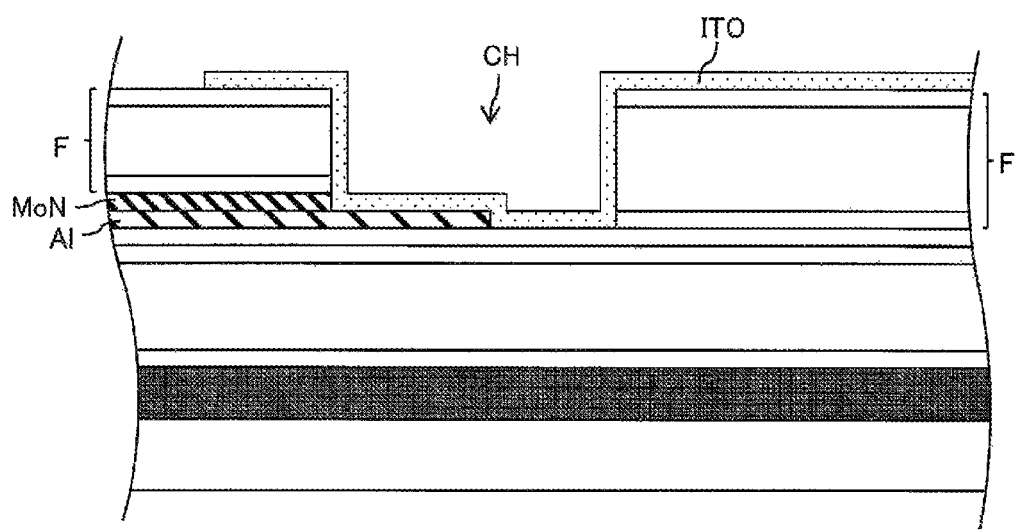
FIG. 16 is a cross-sectional view illustrating a configuration of an active matrix substrate according to a reference embodiment.

In this regard, in the case that a layered film of Al (lower film) and MoN (upper film), for example, is used as the first metal film and ITO, for example, is used as the second metal film, as illustrated in FIG. 16, the upper film (MoN) of the first metal film may be etched in the etching step for forming the contact hole CH in the interlayer insulating film, and as a result, the lower film (Al) of the first metal film and ITO (second metal film) may come into contact with each other within the contact hole and electrolytic corrosion may occur between the films, which may result in a contact failure.

In the configuration of the first embodiment, even when, for example, aluminum is used in the lower film 9x of the first metal film and ITO is used in the second metal film, electrolytic corrosion is unlikely to occur because the films are not in contact with each other. Hence, this configuration prevents the occurrence of a contact failure due to electrolytic corrosion.

Second Embodiment

Figure 7A:
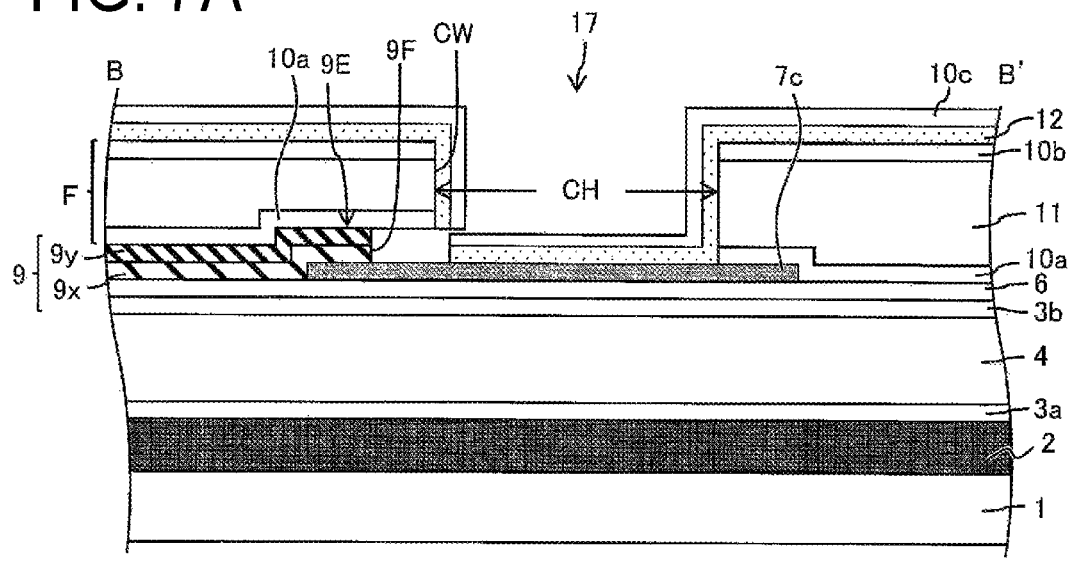
FIGS. 7A and 7B are cross-sectional views illustrating a configuration of an active matrix substrate (contact hole portion) according to a second embodiment.
Figure 7B:
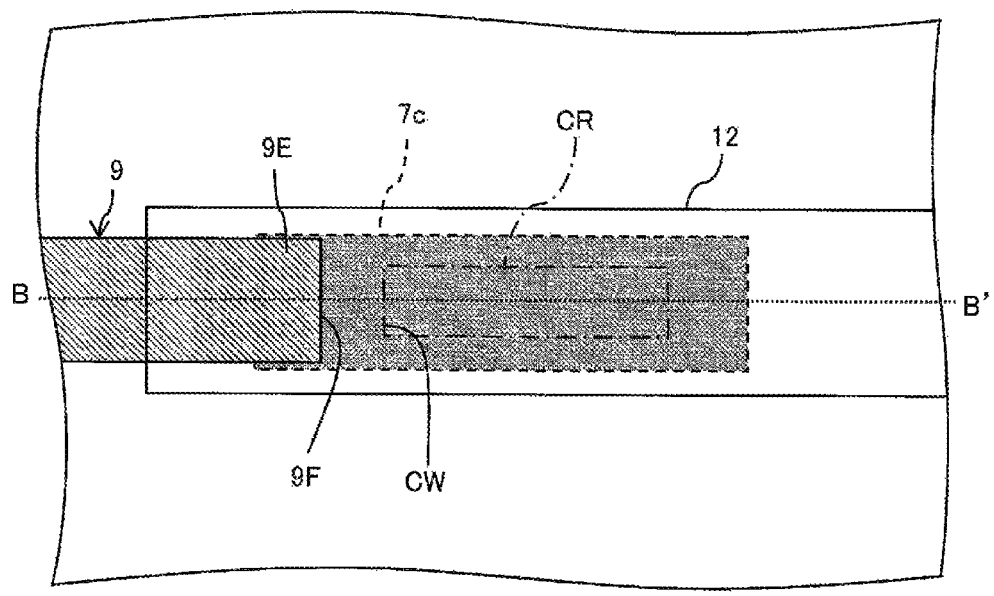

The second embodiment is configured as illustrated in FIGS. 7A and 7B, in comparison with the configuration illustrated in FIGS. 5A and 5B.

As illustrated in FIG. 7A, at the bottom of the contact hole CH provided in the interlayer insulating film F, the conductive film 7c (overlapping portion overlapping with the contact hole) is in contact with the second metal film 12, and the films are electrically connected to each other. The conductive film 7c of FIGS. 7A and 7B is a film obtained by performing a plasma treatment on a semiconductor film formed in the same layer (in the same process) as the oxide semiconductor film 7s of FIGS. 4A and 4B and thus converting the film into a conductor.

Outside of the bottom of the contact hole CH, the perimeter portion (non-overlapping portion not overlapping with the contact hole) of the conductive film 7c and an end portion 9E of the first metal film 9 are in contact with each other and thus electrically connected to each other. In FIG. 7A, as opposed to FIG. 5A, the interlayer insulating film F is not formed between the end face 9F of the first metal film and a portion of the second metal film 12 within the contact hole CH, and thus a cavity is present therebetween.

Figure 8:
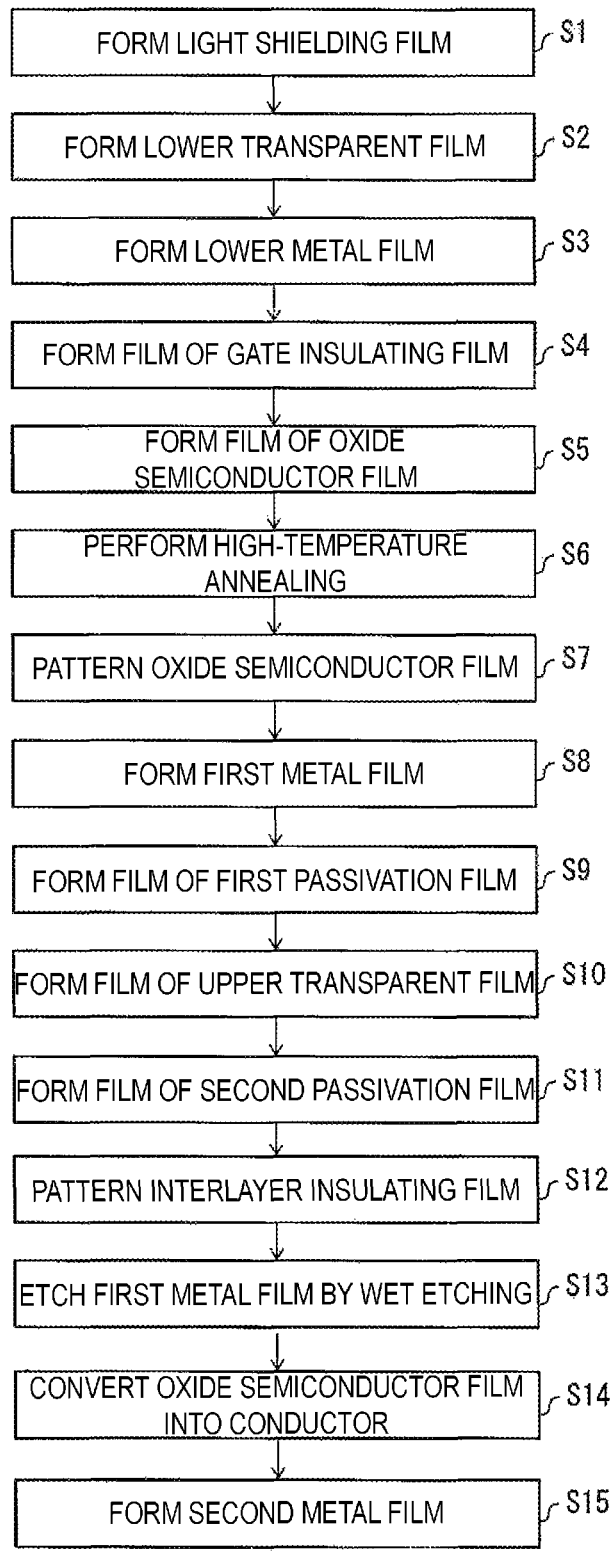
FIG. 8 is a flowchart illustrating a process for manufacturing an active matrix substrate according to the second embodiment.

The configuration of FIGS. 7A and 7B can be formed as illustrated in FIG. 8. Steps S1 to S7 are the same as those in FIG. 6. In step S8, the film of the first metal film 9 (e.g., a layered film of the lower film 9x including Al and the upper film 9y including MoN) is formed and patterned.

Figure 9A:
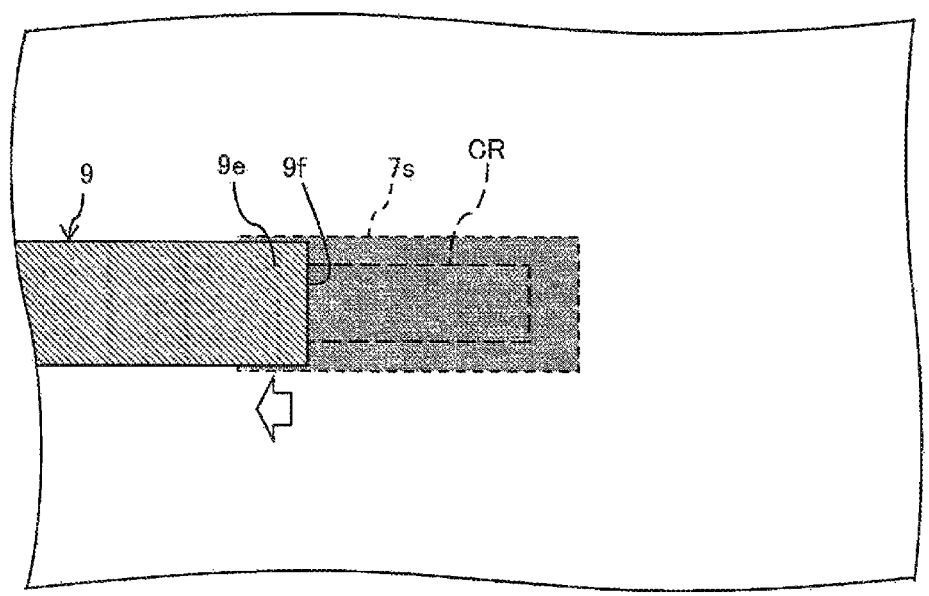
FIGS. 9A and 9B are plan views for illustrating a portion of a process for manufacturing an active matrix substrate according to the second embodiment.

Here, as illustrated in FIG. 9A, the end portion 9e of the first metal film 9 is placed on the perimeter portion (portion extending beyond the contact region CR) of the oxide semiconductor film 7s, and the end face 9f of the first metal film 9 is positioned on or inside the edge of the contact region CR.

In step S9, the film of the first passivation film 10a is formed. In step S10, the film of the upper transparent film 11 is formed. In step S11, the film of the second passivation film 10b is formed.

In step S12, the film of the interlayer insulating film F is formed and patterned. Here, the contact hole CH is formed in the interlayer insulating film F at the portion on the contact region CR, and thus the oxide semiconductor film 7s is exposed at the bottom of the contact hole CH.

Figure 9B:
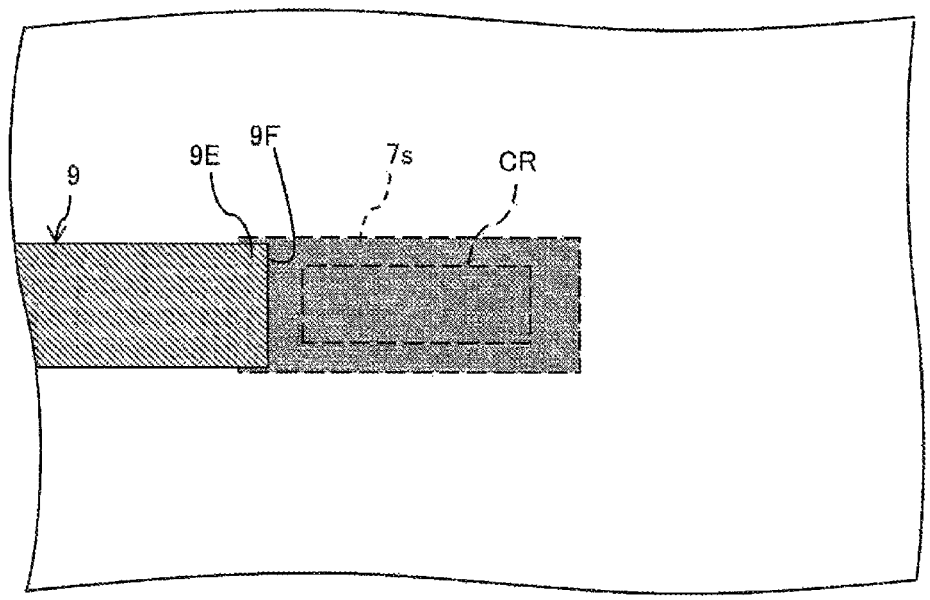

In step S13, the first metal film 9 (9x, 9y) is etched by wet etching, and thus, as illustrated in FIG. 9B, the end face 9F of the first metal film 9 is retracted away from the edge (position of the side wall) of the contact region CR so that the end face 9F of the first metal film 9 can be located outside of the contact region CR and the end portion 9E of the first metal film 9 can overlap with the oxide semiconductor film 7s (the lower film 9x can be in contact with the oxide semiconductor film 7s).

In step S14, a plasma treatment is performed on the oxide semiconductor film 7s at the contact region CR by using, for example, argon, hydrogen, or the like, other than oxygen. Thus, in the oxide semiconductor film 7s overlapping with the contact region CR, the portion overlapping with the end portion 9E of the first metal film 9 and the portion extending from the overlapping portion to the bottom of the contact hole CH (portion on which the interlayer insulating film F is not formed) as well as the portion exposed at the bottom of the contact hole CH are converted into a conductor to form the conductive film 7c. Thus, the conductive film 7c is electrically connected to the first metal film 9 (lower film 9x).

In the configuration of the second embodiment, even when, for example, aluminum is used in the lower film 9x of the first metal film and ITO is used in the second metal film, electrolytic corrosion is unlikely to occur because the films are not in contact with each other. Hence, this configuration prevents the occurrence of a contact failure due to electrolytic corrosion.

In the configuration of FIGS. 7A and 7B, the interlayer insulating film F is not present in the gap (there is a cavity) between the end face 9F of the first metal film 9 and the edge (position of the side wall) of the contact hole CH, and thus the portion of the oxide semiconductor film under the gap can be easily converted into a conductor by performing a plasma treatment. Accordingly, the gap can be configured to be greater than the thickness of the interlayer insulating film F, and the alignment of the oxide semiconductor film 7s in step S7 becomes easy.

In step S15, the second metal film 12 is formed on the interlayer insulating film F. Here, at the bottom of the contact hole CH, the second metal film 12 comes into contact with the conductive film 7c to be electrically connected thereto. As a result, the first metal film 9 and the second metal film 12 are electrically connected to each other with the conductive film 7c therebetween.

In the manner described above, the active matrix substrate 17 of FIGS. 7A and 7B can be formed. Note that, as illustrated in FIG. 7A, the second metal film 12 is disconnected at the side wall portion of the contact hole CH, but the electrical connection to the conductive film 7c is ensured at the near portion.

Third Embodiment

Figure 10:
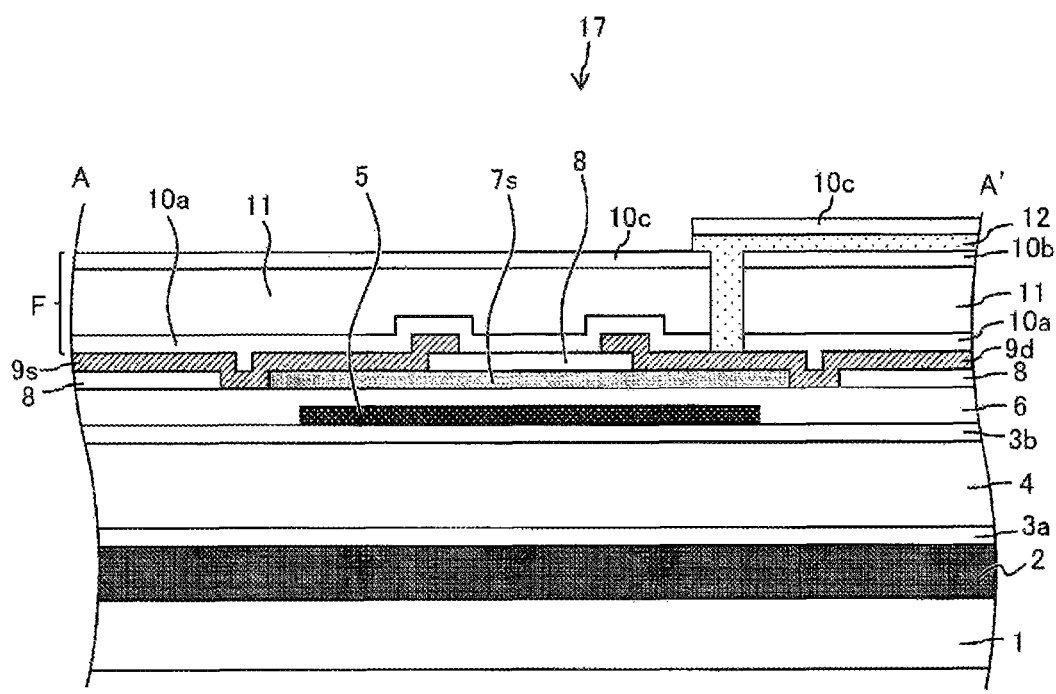
FIG. 10 is a cross-sectional view illustrating a configuration of an active matrix substrate (TFT portion) according to a third embodiment.

In the active matrix substrate of each of the first and second embodiments, the configuration of the TFT portion is of the channel etched type, but the configuration is not limited to this. As illustrated in FIG. 10, it is also possible that an etching stopper film 8 is provided. Specifically, the etching stopper film 8 is formed on the oxide semiconductor film 7s, and the first metal films 9s, 9d are formed on the etching stopper film 8. Note that the etching stopper film 8 is formed by, for example, forming the film of a $SiO_2$ film with a PECVD method and patterning the film.

The etching stopper film 8, when provided, prevents the oxide semiconductor film 7s from being affected by the etching of the first metal film when forming the first metal films 9s, 9d.

Figure 11:
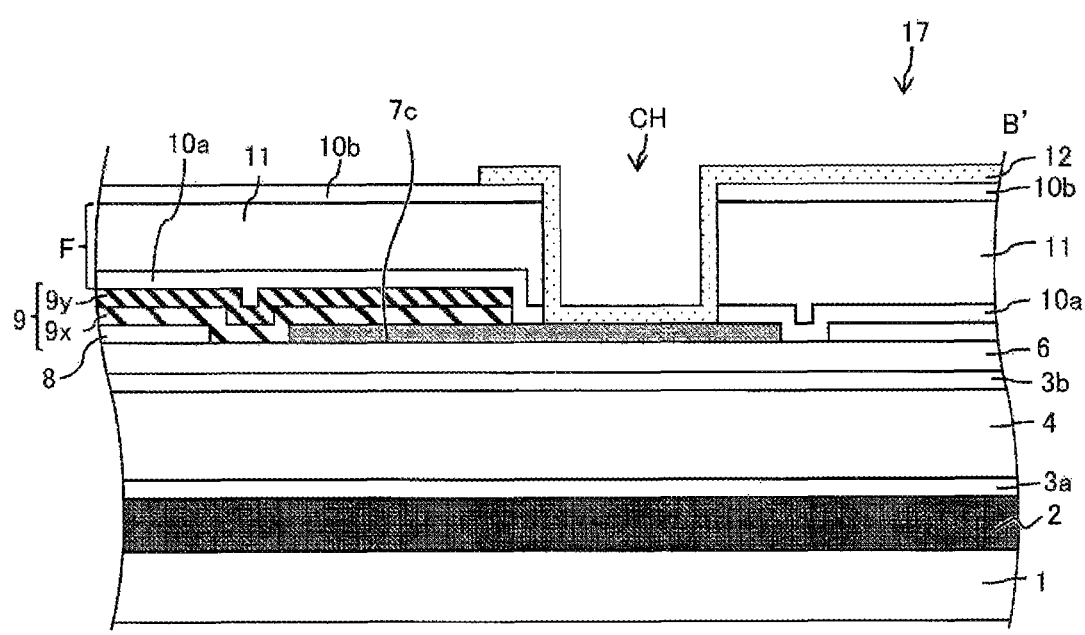
FIG. 11 is a cross-sectional view illustrating a configuration of an active matrix substrate (contact hole portion) according to the third embodiment.
Figure 12:
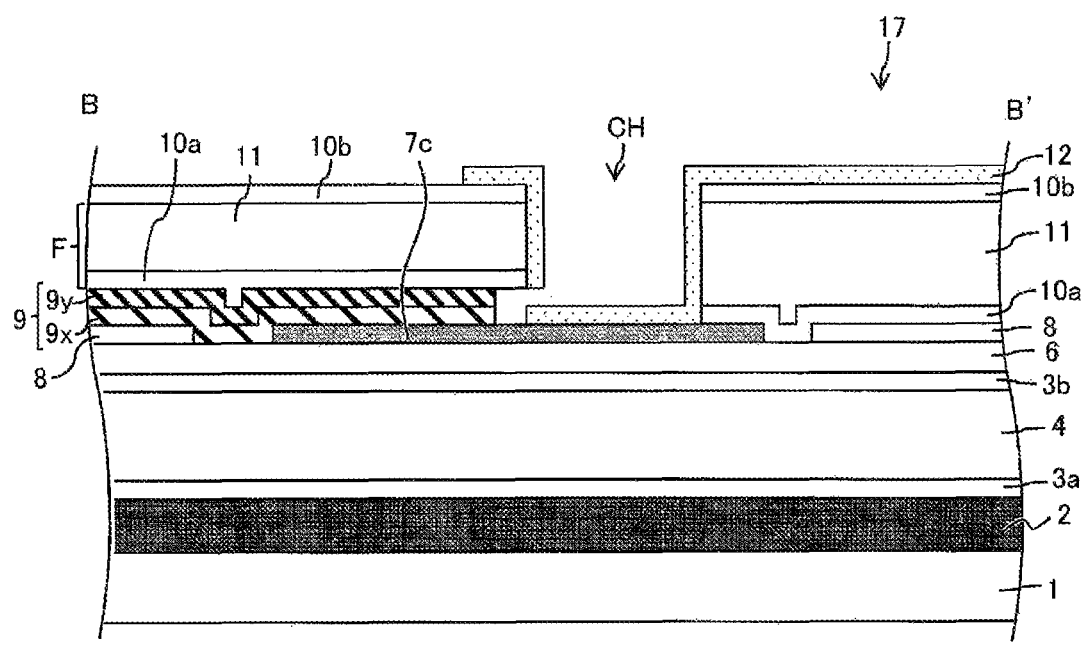
FIG. 12 is a cross-sectional view illustrating another configuration of an active matrix substrate (contact hole portion) according to the third embodiment.

As illustrated in FIGS. 11 and 12, the third embodiment is also configured as follows. The contact hole CH is provided in the interlayer insulating film F, the interlayer insulating film F being an upper layer over the conductive film 7c obtained by converting an oxide semiconductor film into a conductor. Within the contact hole CH, the conductive film 7c is in contact with the second metal film 12 (e.g., a transparent film including ITO). Outside of the contact hole CH, the conductive film 7c is in contact with the first metal film 9 (e.g., a layered film of the lower film 9x including Al and the upper film 9y including MoN).

Note that the configuration may be such that, as illustrated in FIG. 11, a portion of the interlayer insulating film F is present in the gap between the end face 9F of the first metal film 9 and a portion of the second metal film 12 within the contact hole CH or the configuration may be such that, as illustrated in FIG. 12, the interlayer insulating film F is not present in the gap (there is a cavity) between the end face 9F of the first metal film 9 and a portion of the second metal film 12 within the contact hole CH.

Fourth Embodiment

A MEMS display is described in the first embodiment, but the embodiment is not limited thereto. The active matrix substrate of each of the first to third embodiments may be employed in a liquid crystal display device.

Figure 13A:
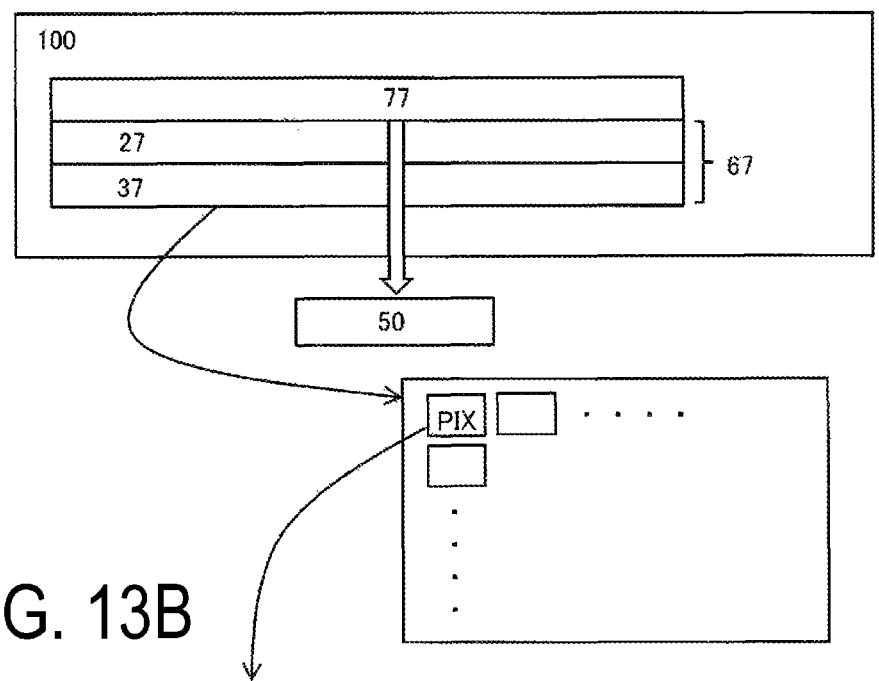
FIGS. 13A and 13B are schematic diagrams illustrating a configuration of a display device according to a fourth embodiment.
Figure 13B:
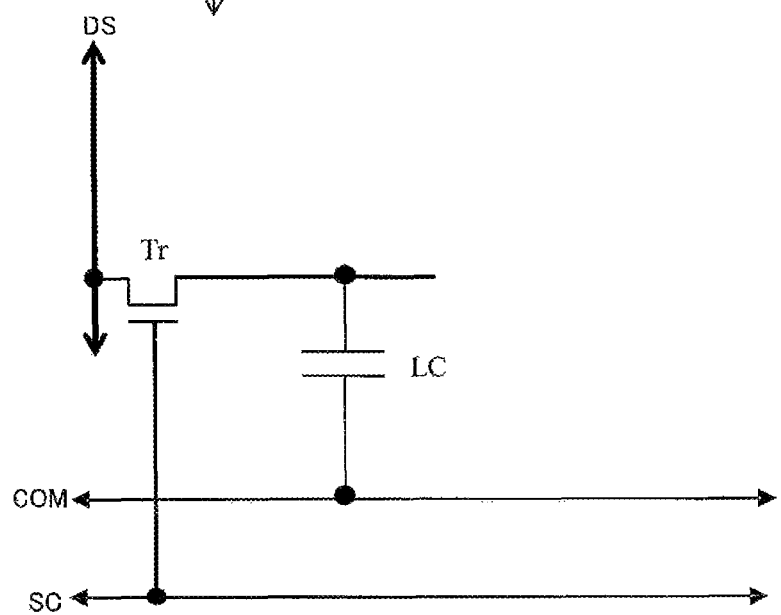

As illustrated in FIG. 13A, a liquid crystal display device 100, according to a fourth embodiment includes a liquid crystal panel 67 and a backlight 77. The liquid crystal panel 67 includes an active matrix substrate 27 and a counter substrate (color filter substrate) 37. The backlight 77 emits LED light or laser light to the active matrix substrate 27. As illustrated in FIG. 13B, in a pixel PIX of the liquid crystal panel 67, the pixel electrode of a liquid crystal capacitor LC is connected to a data signal line DS and a scanning signal line SC with a transistor Tr therebetween, and the counter electrode of the liquid crystal capacitor LC is connected to a common electrode line COM.

Figure 14A:
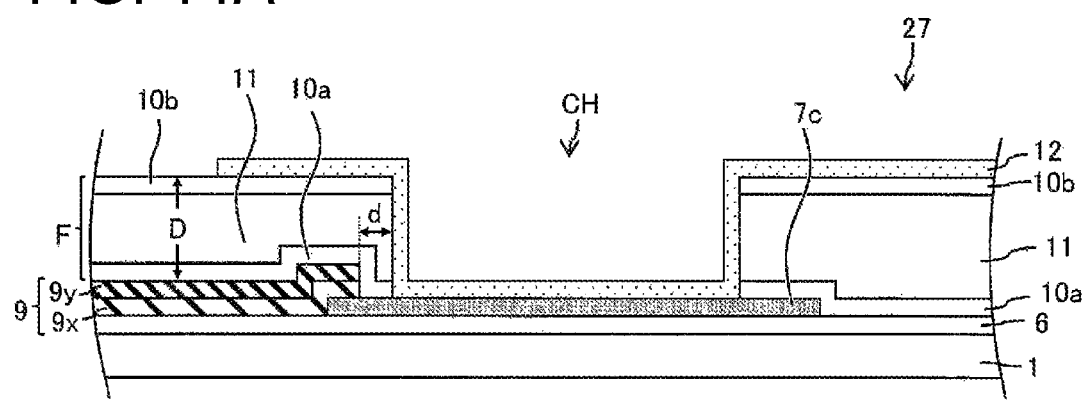
FIGS. 14A and 14B are cross-sectional views illustrating a configuration of an active matrix substrate according to the fourth embodiment.
Figure 14B:
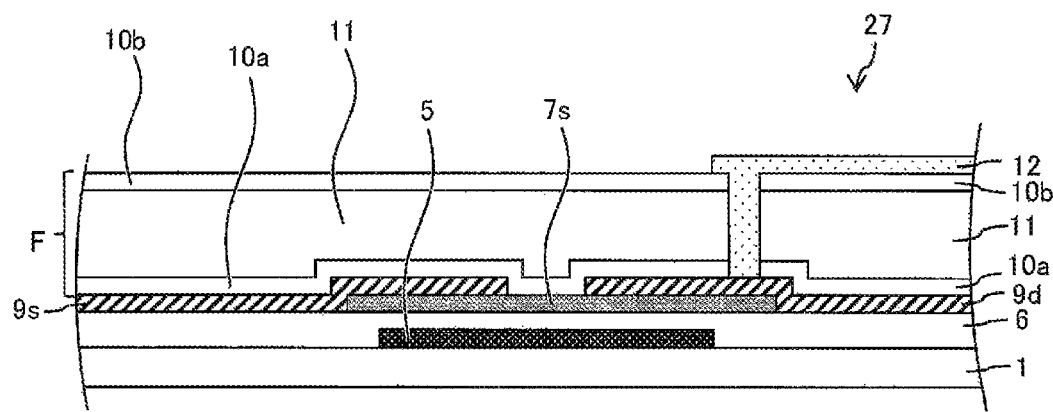
Figure 15A:
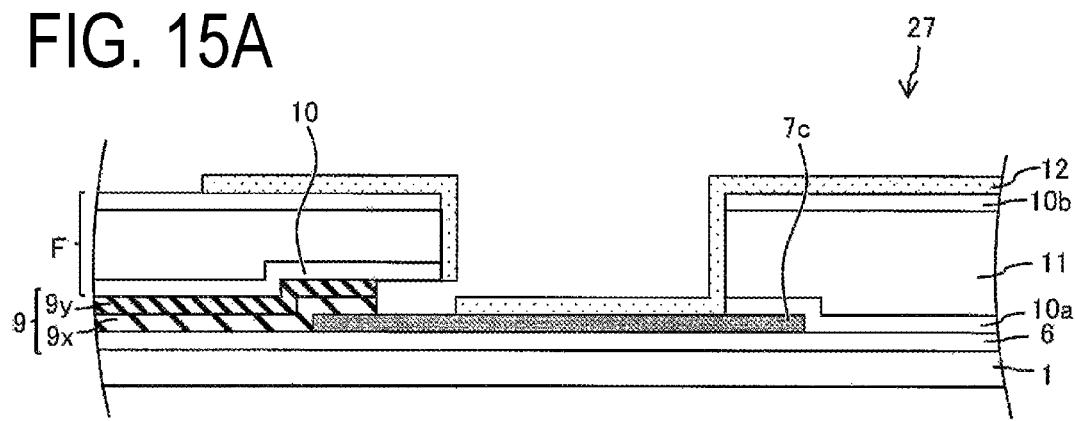
FIGS. 15A and 15B are cross-sectional views illustrating another configuration of an active matrix substrate according to the fourth embodiment.
Figure 15B:
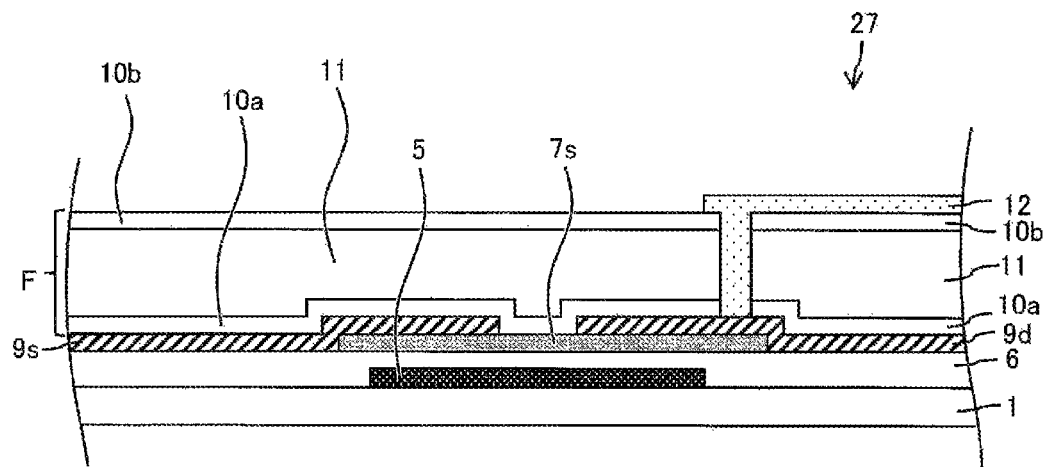

For the liquid crystal panel 67, an active matrix substrate 27 may be used. As illustrated in FIGS. 14A and 14B, the active matrix substrate 27 corresponds to the active matrix substrate 17 of the first embodiment illustrated in FIGS. 4A to 5B except that the light shielding film 2, the first inorganic insulating film 3a, the lower transparent film 4, the second inorganic insulating film 3b, and the third passivation film 10c are not included. Another active matrix substrate 27 may be used. As illustrated in FIGS. 15A and 15B, the active matrix substrate 27 corresponds to the active matrix substrate 17 of the second embodiment illustrated in FIGS. 4A and 4B and FIGS. 7A and 7B except that the light shielding film 2, the first inorganic insulating film 3a, the lower transparent film 4, the second inorganic insulating film 3b, and the third passivation film 10c are not included.

First to Fourth Embodiments

In the active matrix substrate of each of the first to fourth embodiments, the first metal film 9 and the second metal film 12 are electrically connected to each other. The layer in which each of the metal films is to be formed is not limited to the configuration of any of the embodiments. The active matrix substrate according to an embodiment of the disclosure may be employed in display devices in general that include an active matrix substrate having a configuration in which two metal films formed in different layers are electrically connected to each other (and particularly in which electrolytic corrosion may occur in a case where the metal films contact each other). The active matrix substrate is also suitable for organic electroluminescence (organic EL) displays and inorganic electroluminescence (inorganic EL) displays.

Supplement

According to a first aspect of the disclosure, an active matrix substrate includes a substrate, a first metal film and an interlayer insulating film, and a second metal film. The interlayer insulating film is formed in an upper layer on the first metal film. The second metal film is formed in the upper layer on the interlayer insulating film. The first metal film and the second metal film are electrically connected to each other via a contact hole formed in the interlayer insulating film. An oxide semiconductor film converted into a conductor is provided in a layer between the substrate and the first metal film. Within the contact hole, the oxide semiconductor film converted into a conductor is in contact with the second metal film. Outside of the contact hole, the oxide semiconductor film converted into a conductor is in contact with the first metal film.

According to a second aspect of the disclosure, the active matrix substrate is configured as follows. In the first aspect, the first metal film does not overlap with the contact hole.

According to a third aspect of the disclosure, the active matrix substrate is configured as follows. In the first or second aspect, the oxide semiconductor film converted into a conductor overlaps with the entirety of the inner region of the contact hole.

According to a fourth aspect of the disclosure, the active matrix substrate is configured as follows. In the second aspect, an end portion of the first metal film includes an end face facing a side wall of the contact hole, and a distance from the end face to the side wall of the contact hole is less than a thickness of the interlayer insulating film.

According to a fifth aspect of the disclosure, the active matrix substrate is configured as follows. In the second aspect, an end portion of the first metal film is located away from the contact hole, and a cavity is formed between the end portion of the first metal film and a portion of the second metal film within the contact hole.

According to a sixth aspect of the disclosure, the active matrix substrate is configured as follows. In any one of the first to fifth aspects, the second metal film includes a transparent metal film.

According to a seventh aspect of the disclosure, the active matrix substrate is configured as follows. In any one of the first to sixth aspects, the oxide semiconductor film converted into a conductor includes a conductive film formed in a layer identical to a layer in which an oxide semiconductor film serving as a channel of a transistor is formed.

According to an eighth aspect of the disclosure, the active matrix substrate is configured as follows. In any one of the first to seventh aspects, the first metal film includes aluminum.

According to a ninth aspect of the disclosure, an optical shutter substrate includes the active matrix substrate according to any one of the first to eighth aspects and an optical shutter mechanism formed on the active matrix substrate.

According to a tenth aspect of the disclosure, a display device includes the active matrix substrate according to any one of the first to eighth aspects.

According to an eleventh aspect of the disclosure, a method for manufacturing an active matrix substrate includes first to sixth steps. In the first step, an oxide semiconductor film is formed. In the second step, a first metal film is formed in an upper layer on the oxide semiconductor film. In the third step, an interlayer insulating film is formed in an upper layer on the first metal film. In the fourth step, a contact hole is formed in the interlayer insulating film to expose a portion of the oxide semiconductor film. In the fifth step, a plasma treatment is performed on the oxide semiconductor film, and the oxide semiconductor film is converted into a conductive film. In the sixth step, a second metal film is formed such that the second metal film covers a portion of the conductive film within the contact hole.

According to a twelfth aspect of the disclosure, the method for manufacturing an active matrix substrate includes the following technique. In the eleventh aspect, in the second step, the first metal film is formed such that the first metal film does not overlap with a location where the contact hole is to be formed and such that the first metal film is in contact with the oxide semiconductor film.

According to a thirteenth aspect of the disclosure, the method for manufacturing an active matrix substrate includes the following technique. In the eleventh aspect, in the second step, the first metal film is formed such that the first metal film overlaps with a location where the contact hole is to be formed and such that the first metal film is in contact with the oxide semiconductor film, and, between the fourth step and the fifth step, the first metal film is etched such that the first metal film is in contact with the oxide semiconductor film but does not overlap with the contact hole.

The disclosure is not limited to the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

1 Glass substrate
2 Light shielding film
4 Lower transparent film
5 Lower metal film
6 Gate insulating film
7 Oxide semiconductor film
7s Oxide semiconductor film 7c Conductive film (oxide semiconductor film converted into conductor)
9 First metal film
10a to 10c First to third passivation films
11 Upper transparent film
12 Second metal film
13 Upper metal film
17 Active matrix substrate
20 Optical shutter substrate
21 Optical shutter mechanism
22x, 22y Drive beam
23x, 23y Shutter beam
27 Active matrix substrate
28 Shutter body
30 Counter substrate
LW Light transmission path
F Interlayer insulating film

The invention claimed is:

1. An active matrix substrate comprising:
a substrate;
a first metal film;
an interlayer insulating film formed in an upper layer on the first metal film; and
a second metal film formed in an upper layer on the interlayer insulating film, the first metal film and the second metal film being electrically connected to each other via a contact hole formed in the interlayer insulating film,
wherein an oxide semiconductor film converted into a conductor is provided in a layer between the substrate and the first metal film,
within the contact hole, the oxide semiconductor film converted into a conductor is in contact with the second metal film,
outside of the contact hole, the oxide semiconductor film converted into a conductor is in contact with the first metal film,
the first metal film does not overlap with the contact hole,
an end portion of the first metal film includes an end face facing a side wall of the contact hole, and
a distance from the end face to the side wall of the contact hole is less than a thickness of the interlayer insulating film.

2. The active matrix substrate according to claim 1,
wherein the oxide semiconductor film converted into a conductor overlaps with an entirety of an inner region of the contact hole.

3. The active matrix substrate according to claim 1,
wherein an end portion of the first metal film is located away from the contact hole, and a cavity is formed between the end portion of the first metal film and a portion of the second metal film within the contact hole.

4. The active matrix substrate according to claim 1,
wherein the second metal film includes a transparent metal film.

5. The active matrix substrate according to claim 1,
wherein the oxide semiconductor film converted into a conductor includes a conductive film formed in a layer identical to a layer in which an oxide semiconductor film serving as a channel of a transistor is formed.

6. The active matrix substrate according to claim 1,
wherein the first metal film includes aluminum.

7. An optical shutter substrate comprising:
the active matrix substrate according to claim 1; and
an optical shutter mechanism formed on the active matrix substrate.

8. A display device comprising the active matrix substrate according to claim 1.

9. A method for manufacturing an active matrix substrate, the method comprising:
a first step of forming an oxide semiconductor film;
a second step of forming a first metal film in an upper layer on the oxide semiconductor film;
a third step of forming an interlayer insulating film in an upper layer on the first metal film;
a fourth step of forming a contact hole in the interlayer insulating film to expose a portion of the oxide semiconductor film;
a fifth step of performing a plasma treatment on the oxide semiconductor film and converting the oxide semiconductor film into a conductive film; and
a sixth step of forming a second metal film such that the second metal film covers a portion of the conductive film within the contact hole; wherein
in the second step, the first metal film is formed such that the first metal film overlaps with a location where the contact hole is to be formed and such that the first metal film is in contact with the oxide semiconductor film, and
between the fourth step and the fifth step, the first metal film is etched such that the first metal film is in contact with the oxide semiconductor film but does not overlap with the contact hole.

* * * * *